United States Patent
Bang et al.

(10) Patent No.: US 7,646,360 B2
(45) Date of Patent: Jan. 12, 2010

(54) PLASMA DISPLAY APPARATUS AND METHOD OF MANUFACTURING CHASSIS BASE USED THEREFOR

(75) Inventors: Won-Kyu Bang, Suwon-si (KR); Guy-Seong Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 842 days.

(21) Appl. No.: 11/109,686

(22) Filed: Apr. 20, 2005

(65) Prior Publication Data
US 2005/0236995 A1    Oct. 27, 2005

(30) Foreign Application Priority Data
Apr. 21, 2004    (KR)    ............ 10-2004-0027414

(51) Int. Cl.
*G09G 3/28*    (2006.01)
(52) U.S. Cl. .................................... 345/60
(58) Field of Classification Search ............ 345/60, 345/76, 169, 905, 4, 5, 204, 108, 41, 3.1, 345/214, 206; 361/681, 719, 703, 683, 699, 361/818; 315/169.3, 169.4; 313/46, 587, 313/582; 362/494, 294; 359/871, 838, 850, 359/865; 348/787
See application file for complete search history.

(56) References Cited

U.S. PATENT DOCUMENTS

| | | | | |
|---|---|---|---|---|
| 5,383,098 A * | 1/1995 | Ma et al. | ................ | 361/818 |
| 5,831,824 A * | 11/1998 | McDunn et al. | ........... | 361/699 |
| 5,971,566 A * | 10/1999 | Tani et al. | ................ | 362/294 |
| 5,982,355 A * | 11/1999 | Jaeger et al. | .............. | 345/161 |
| 6,188,569 B1 * | 2/2001 | Minemoto et al. | ......... | 361/683 |
| 6,542,366 B2 * | 4/2003 | Davis et al. | .............. | 361/703 |
| 6,902,284 B2 * | 6/2005 | Hutzel et al. | .............. | 359/865 |
| 7,352,601 B1 * | 4/2008 | Minneman et al. | ........... | 365/51 |
| 7,535,174 B2 * | 5/2009 | Shin | ...................... | 313/582 |
| 2002/0060248 A1 * | 5/2002 | Fan | ...................... | 235/486 |
| 2002/0105785 A1 * | 8/2002 | Davis et al. | ............... | 361/703 |
| 2002/0127363 A1 * | 9/2002 | Kaneko et al. | ............ | 428/40.1 |
| 2003/0016817 A1 * | 1/2003 | Koester et al. | ............ | 379/430 |
| 2003/0020152 A1 * | 1/2003 | Inoue et al. | ............... | 257/684 |
| 2004/0008157 A1 * | 1/2004 | Brubaker et al. | ............ | 345/8 |
| 2004/0114058 A1 * | 6/2004 | Lim | ...................... | 348/787 |

(Continued)

FOREIGN PATENT DOCUMENTS

CN    1459768    12/2003

(Continued)

*Primary Examiner*—Prabodh Dharia
(74) *Attorney, Agent, or Firm*—Robert E. Bushnell, Esq.

(57) ABSTRACT

A plasma display apparatus includes a plasma display panel, a chassis base having a first surface to which the plasma display panel is attached and a second surface on which a driving circuit module is installed, and at least one gripper provided on the second surface of the chassis base, the gripper being integrally formed with the chassis base, the gripper being protruded with respect to the second surface of the chassis base. A technique of manufacturing a chassis base for a plasma display apparatus, includes applying a press working process to a chassis base body to provide a chassis base, forming a pair of parallel incision lines on the chassis base, and pressing a portion partitioned by the incision lines toward a thickness direction of the chassis base to form a grip body.

20 Claims, 5 Drawing Sheets

U.S. PATENT DOCUMENTS

| | | | |
|---|---|---|---|
| 2004/0201351 A1* | 10/2004 | Woo et al. | 313/582 |
| 2004/0212554 A1* | 10/2004 | Kim et al. | 345/41 |
| 2005/0041048 A1* | 2/2005 | Hillman et al. | 345/905 |
| 2005/0046618 A1* | 3/2005 | Kim et al. | 345/60 |
| 2005/0073515 A1* | 4/2005 | Kee et al. | 345/204 |
| 2005/0174301 A1* | 8/2005 | Kim | 345/3.1 |
| 2005/0237702 A1* | 10/2005 | Kee et al. | 361/681 |
| 2005/0264986 A1* | 12/2005 | Kee et al. | 361/681 |
| 2006/0002123 A1* | 1/2006 | Hutzel et al. | 362/494 |
| 2008/0080076 A1* | 4/2008 | Hutzel et al. | 359/871 |

FOREIGN PATENT DOCUMENTS

| | | |
|---|---|---|
| JP | 7-44880 | 2/1995 |
| JP | 8-95331 | 4/1996 |
| JP | 10-126716 | 5/1998 |
| JP | 10-207385 | 8/1998 |
| JP | 10-207390 | 8/1998 |
| JP | 11-288825 | 10/1999 |
| JP | 2000-74022 | 3/2000 |
| JP | 2001-10344 | 1/2001 |
| JP | 2003-22030 | 1/2003 |
| JP | 2003-29643 | 1/2003 |
| JP | 2003-223113 | 8/2003 |

* cited by examiner

PLASMA DISPLAY APPARATUS AND METHOD OF MANUFACTURING CHASSIS BASE USED THEREFOR

CLAIM OF PRIORITY

This application makes reference to, incorporates the same herein, and claims all benefits accruing under 35 U.S.C. § 119 from an application for PLASMA DISPLAY APPARATUS AND METHOD OF MANUFACTURING CHASSIS BASE USED THEREFOR earlier filed in the Korean Intellectual Property Office on 21 Apr. 2004 and there duly assigned Ser. No. 10-2004-0027414.

BACKGROUND OF THE INVENTION

1. Field of the Invention

The present invention relates to a plasma display apparatus, and more particularly, to a plasma display apparatus having a gripper structure integrally formed with a chassis base and a method of manufacturing a chassis base having the same.

2. Description of Related Art

Generally, a plasma display apparatus is an apparatus for displaying an image on a plasma display panel by using plasma generated by gaseous discharge.

Such a plasma display apparatus basically includes a plasma display panel, a chassis base disposed substantially in parallel with the plasma display panel, a heat conduction medium closely interposed between the plasma display panel and the chassis base, and a driving circuit module mounted on a surface opposite to the surface on which the panel is mounted and connected with the plasma display panel to drive it. Further, a front case is provided on the plasma display panel side and a rear cover is provided on the driving circuit module side to form a display assembly.

Since such a plasma display apparatus is usually made in a large size, for example, 40 inches (diagonal measurement) or more, its conveyability is bad. Particularly, this problem is serious when it is required to convey a plasma display module during an assembly process or maintenance, or when it is required to package the module to transport it to a distant assembly vendor because several persons or a conveyer machine should grasp corners of the chassis base to carry it. Furthermore, if carriers are not careful, the module may be dropped down and damaged.

SUMMARY OF THE INVENTION

It is therefore, an object of the present invention to provide a plasma display apparatus having a gripper structure integrally formed with a chassis base and a method of manufacturing a chassis base used therefor, by which a conveyance work can become easy, productivity of the plasma display modules can be improved, and manufacturing cost can be accordingly reduced.

It is another object of the present invention to provide a plasma display apparatus including a structure on a chassis of the plasma display apparatus that accommodates easy implementation while providing increased efficiency of the making of the plasma display apparatus and still improving reliability.

It is yet another object of the present invention to provide a plasma display apparatus that accommodates manufacturing safety by preventing a user from being injured by edged portions of the plasma display accommodating a user's grasp of the plasma display panel.

According to an aspect of the present invention, there is provided a plasma display apparatus including: a plasma display panel; a chassis base having a first surface to which the plasma display panel is attached and a second surface on which a driving circuit module is installed; and at least one gripper provided on the second surface of the chassis base, the gripper being integrally formed with the chassis base, the gripper being protruded with respect to the second surface of the chassis base.

At least a pair of grippers may be provided in an upper end portion of the second surface and a lower end portion of the second surface, respectively.

The chassis base may be formed by a press working process to have a rectangular shape consisting of a pair of long sides and a pair of short sides, and the grippers may be located in symmetrical positions with respect to a center axis of the long side of the chassis base.

The gripper may have a grip body partitioned by a pair of parallel incision lines, and the grip body may be protruded toward exterior of the second surface, and both ends of the grip body may be integrally connected with the second surface. In this case, the incision lines may be formed in the direction of the long side of the chassis base, or in the direction of the short side of the chassis base. The incision lines may be formed by a slitting process or a notching process.

The gripper may have an arc portion formed by bending an edge of the grip body to make a thickness.

According to another aspect of the present invention, there is provided a method of manufacturing a chassis base for a plasma display apparatus, including the steps of: applying a press working process to a chassis base body to provide a chassis base; forming a pair of parallel incision lines on the chassis base; and pressing a portion partitioned by the incision lines toward a thickness direction of the chassis base to form a grip body.

A pair of the incision lines may be formed by a slitting process or a notching process. A pair of the incision lines may be formed in each corner of the chassis base.

The method may further include a step of bending an edge of the grip body to form an arc portion.

According to the present invention, it is possible to provide a gripper structure integrally formed with the chassis base. Therefore, it is possible to facilitate a conveyance work, simplify a manufacturing process, and reduce manufacturing cost.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
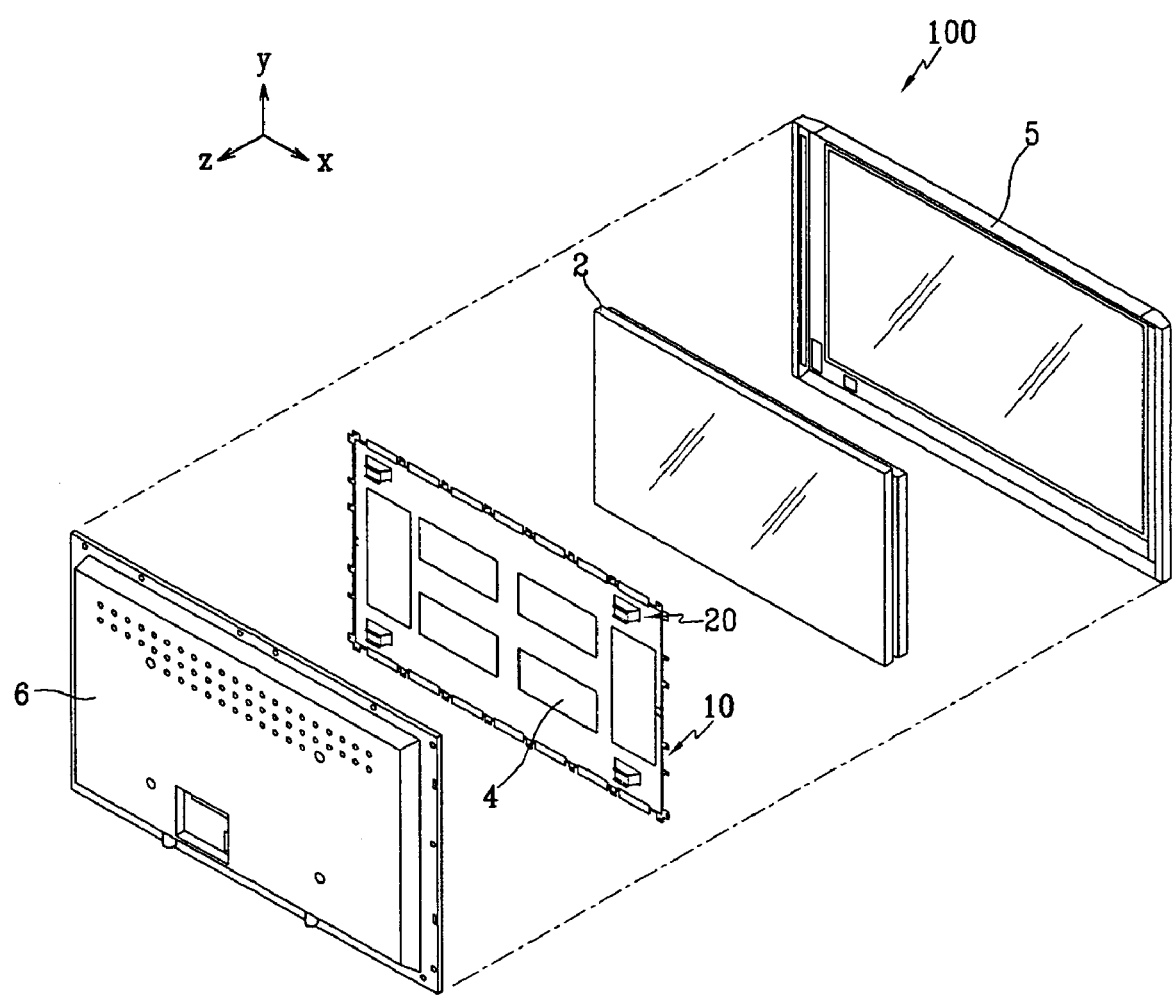
FIG. 1 is an exploded perspective view illustrating a plasma display apparatus according to a first embodiment of the present invention.

FIG. 1 is an exploded perspective view illustrating a plasma display apparatus according to a first embodiment of the present invention.

Referring to FIG. 1, a plasma display apparatus 100 according to a first embodiment of the present invention basically includes a plasma display panel 2, a chassis base 10 supporting the plasma display panel 2 on its front surface and having a driving circuit module 4 on its rear surface, a front cabinet 5 located in front of the plasma display panel 2, and a rear cover 6 located behind the chassis base 10 to contain it.

In the plasma display apparatus 100, the front cabinet 5 is assembled into the rear cover 6 containing the chassis base 10 by screws passing through the chassis base 10 to form external dimensions of the plasma display apparatus 100.

The chassis base 10 has a substantially rectangular shape consisting of a pair of long sides and a pair of short sides, and is usually produced by a die-casting process or a press working process. Also, the chassis base 10 may be made of a material selected from a group including copper, iron, and aluminum because they have structural integrity sufficient to support the plasma display panel as well as excellent heat sink performance to effectively discharge the heat generated in the driving circuit module 4 and the plasma display panel 2.

In addition, the chassis base 10 has a front surface onto which the plasma display panel 2 is attached in parallel with the chassis base 10 and a rear surface onto which the driving circuit module 4 is mounted. Further, a sheet type heat conduction member (not shown) may be provided between the chassis base 10 and the plasma display panel 2 to discharge the heat generated in the plasma display panel 2 through the chassis base 10 to external.

According to a first embodiment of the present invention, the rear surface of the chassis base 10 has one or more grippers 20 integrally formed with the chassis base so as to be protruded from the rear surface of the chassis base. A pair of grippers may be located in the upper left and upper right corners of the rear surface. Also, a pair of grippers may be located in the lower left and lower right corners of the rear surface. A pair of grippers may be located in symmetrical positions with respect to the center axis of the long side of the chassis base 10. Preferably, the grippers 20 may be located in each corner of the rear surface of the chassis base 10.

Optionally, the grippers 20 may be located not only in the corners of the rear surface of the chassis base 10 but also in the center positions between each corner, symmetrically with respect to the center axis of the long side of the chassis base 10. However, hereinafter, we will discuss a case that the grippers 20 are provided in each corner of the rear surface of the chassis base 10.

Figure 2:
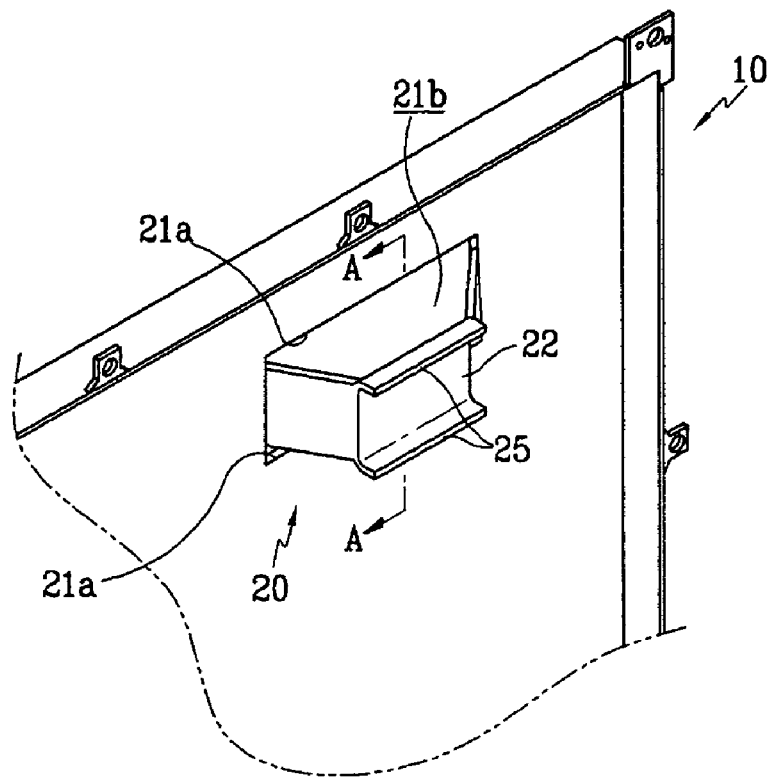
FIG. 2 is a partially enlarged perspective view illustrating a gripper of a chassis base.
Figure 3:
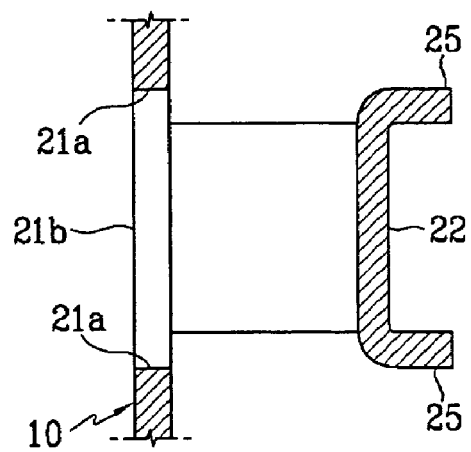
FIG. 3 is a cross-sectional view across a line A-A of FIG. 2.

FIG. 2 is a partially enlarged perspective view illustrating a gripper of a chassis base, and FIG. 3 is a cross-sectional view across a line A-A of FIG. 2.

Referring to FIGS. 2 and 3, a pair of parallel incision lines 21a are provided on a corner of the chassis base 10 according to a first embodiment of the present invention. For example, the parallel incision lines 21a may be formed in the direction of the long side of the chassis base 10. The incision lines 21a may be formed by a typical slitting process or a notching process.

Preferably, the gripper 20 has a grip body 22 to allow a user's grasp. The grip body 22 may be formed by jutting out or projecting the portion accordingly partitioned by a pair of incision lines 21a with respect to the rear surface of the chassis base 10 by a predetermined external force.

More specifically, the portion partitioned by a pair of incision lines 21a is pressed toward an external direction with respect to the rear surface of the chassis base 10 so that both ends of the grip body 22 are extended to the rear surface of the chassis base 10 and bent toward the external or outward direction. In this case, since a pair of incision lines 21a are elongated in the direction of the long side of the chassis base 10, the grip body 22 is also elongated in the direction of the long side of the chassis base 10.

In addition, since the grip body 22 is protruded from the rear surface of the chassis base 10, a spacing hole 21b can be provided in a location corresponding to the pair of incision lines 21a and both ends of the grip body 22. As a result, the heat conduction member located between the chassis base 10 and the plasma display panel 2 can be exposed through the spacing hole 21b. This will facilitate understanding of a structure of the gripper 20 according to the present invention.

The grip body 22 may be formed in a simultaneous manner when the chassis base 10 is formed by, for example, a press working process. Alternatively, the grip body 22 may be formed by a separate press process after the chassis base 10 is formed by a press working process.

According to the present embodiment, in order to prevent a user's hands from being injured by the sharp edged portions of grip body 22, arc portions 25 are provided by bending both edges of the grip body 22 to make a thickness. More specifically, the arc portion 25 may be formed by bending the edge of the grip body 22 toward the front surface or the rear surface of the chassis base 10 with respect to the grip body 22. However, drawings of the present invention exemplarily illustrate a case that the arc portion 25 is bent toward the rear surface of the chassis base 10 with respect to the grip body 22.

Figure 4:
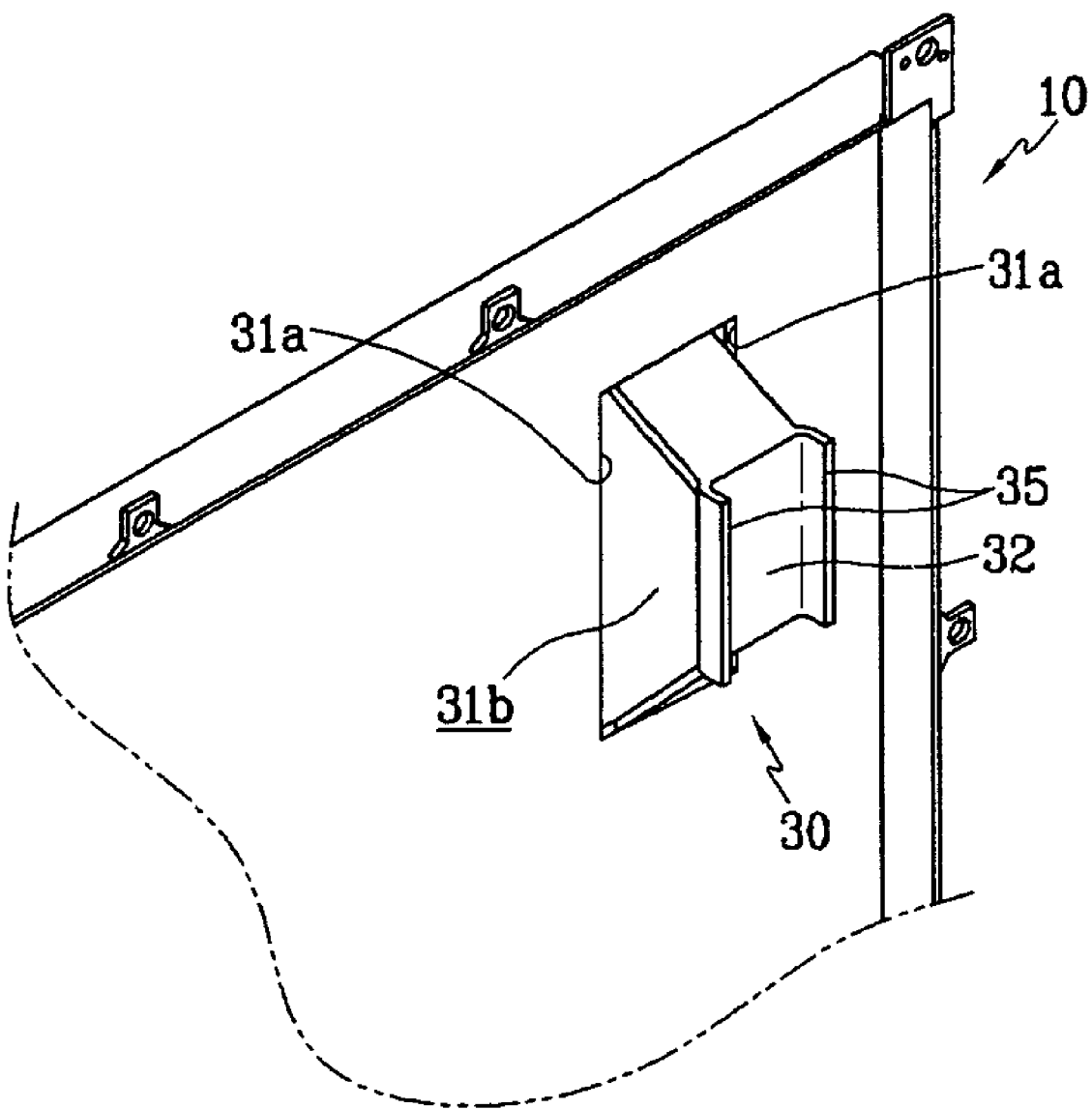
FIG. 4 is a perspective view illustrating a grip body of a plasma display apparatus according to a second embodiment of the present invention.

FIG. 4 is a perspective view illustrating a grip body of a plasma display apparatus according to a second embodiment of the present invention.

Referring to FIG. 4, the gripper 30 has a grip body 32 elongated in the direction of the short side of the chassis base 10. That is, since a pair of the parallel incision lines 31a are formed in the direction of the short side of the chassis base 10, the gripper 30 can be elongated in the direction of the short side of the chassis base 10. FIG. 4 also includes a spacing hole 31b and arc portion 35 as described with the related structures of the first embodiment.

According to the second embodiment of the present invention, the grippers 30 are integrally connected with the plane surface of the chassis base 10 and protruded from the chassis base 10. Therefore, it is possible to facilitate conveyance of the plasma display module during a process of manufacturing a plasma display module by assembling a plasma display panel and a chassis base, a process of packaging the plasma display module, or maintenance of the plasma display module. Furthermore, it is possible to simplify a process of manufacturing a plasma display module and accordingly reduce manufacturing cost.

FIGS. 5A through 5D are detailed diagrams for describing a method of manufacturing a chassis base for a plasma display apparatus according to a first embodiment of the present invention.

Figure 5A:
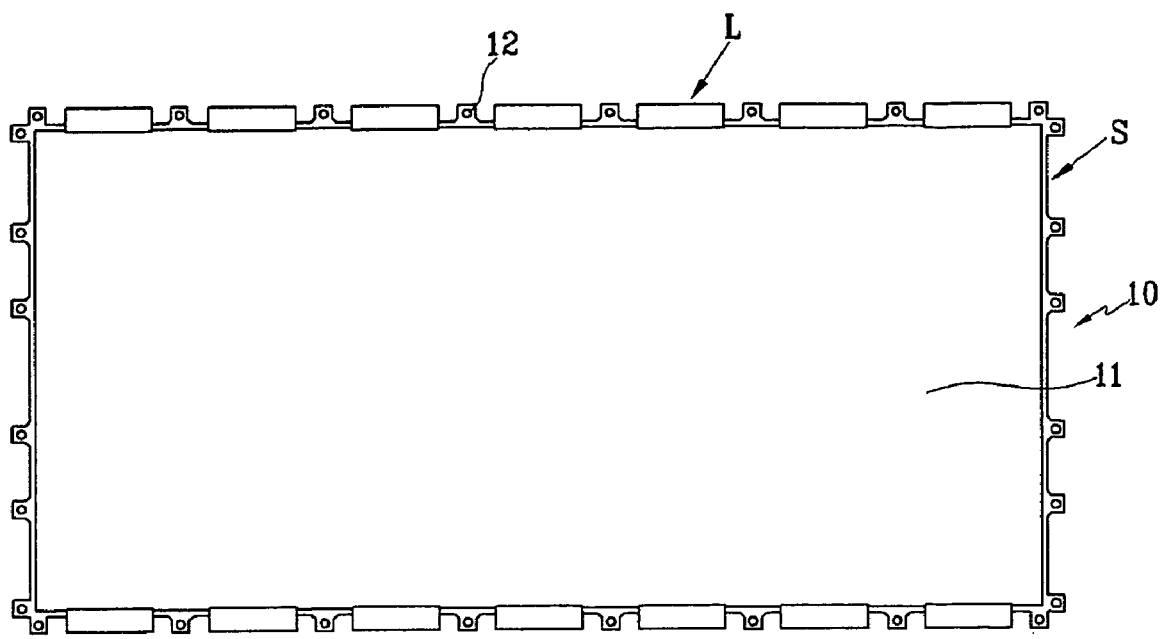
FIGS. 5A through 5D are detailed diagrams for describing a method of manufacturing a chassis base for a plasma display apparatus according to a first embodiment of the present invention.

Referring to FIG. 5A, a chassis base body 11 having a rectangular-plate shape consisting of a pair of long sides L and a pair of short sides S is prepared. Then, a press working process is applied to the chassis base body 11 to form the chassis base 10 according to the present invention. Through the press working process, a plurality of jointing portions are provided along the edges of the chassis base body 11, and a plurality of bosses (not shown) are provided on an upper surface of the chassis base body 11.

Figure 5B:
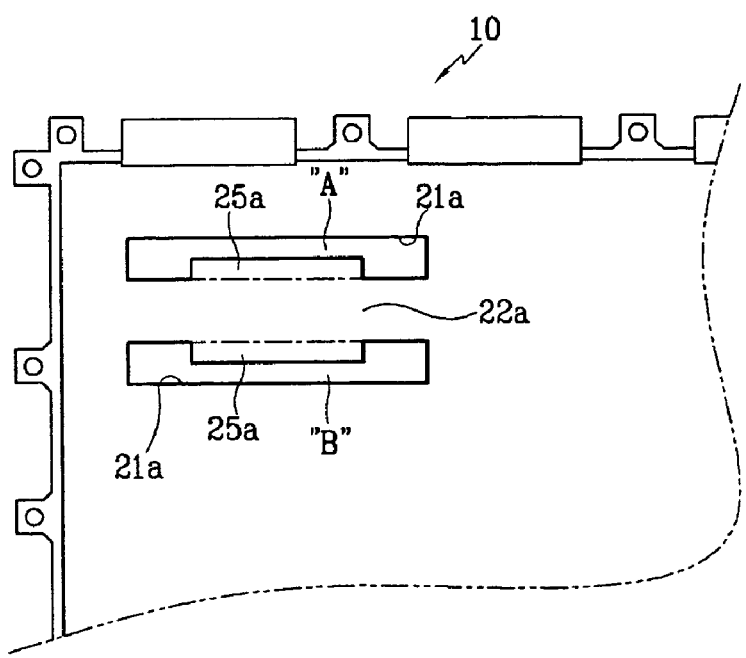

Referring to FIG. 5B, a pair of parallel incision lines 21a are formed in a corner of the chassis base 10. Through a typical slitting or notching process, a first portion indicated as "A" and a second portion indicated as "B" are removed. By removing the first and second portions, a pair of incision lines 21a paralleled in the direction of the long side of the chassis base 10 are provided. By applying this process to each corner, a gripper body 22a is formed in each corner of the chassis base 10. In FIG. 5B, a one-dotted line indicates a line for marking off an arc portion 25a that will be protruded in the shape of a wing on both edges of the gripper body 22a which is provided in parallel with the incision lines 21a.

Figure 5C:
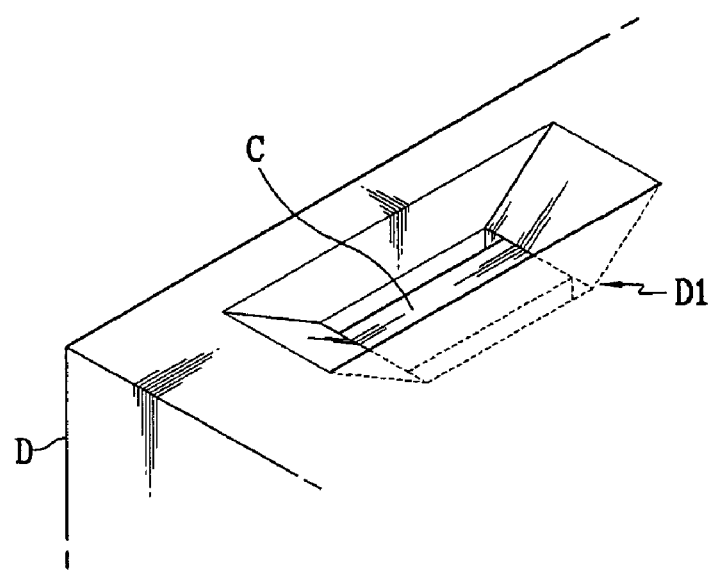
Figure 5D:
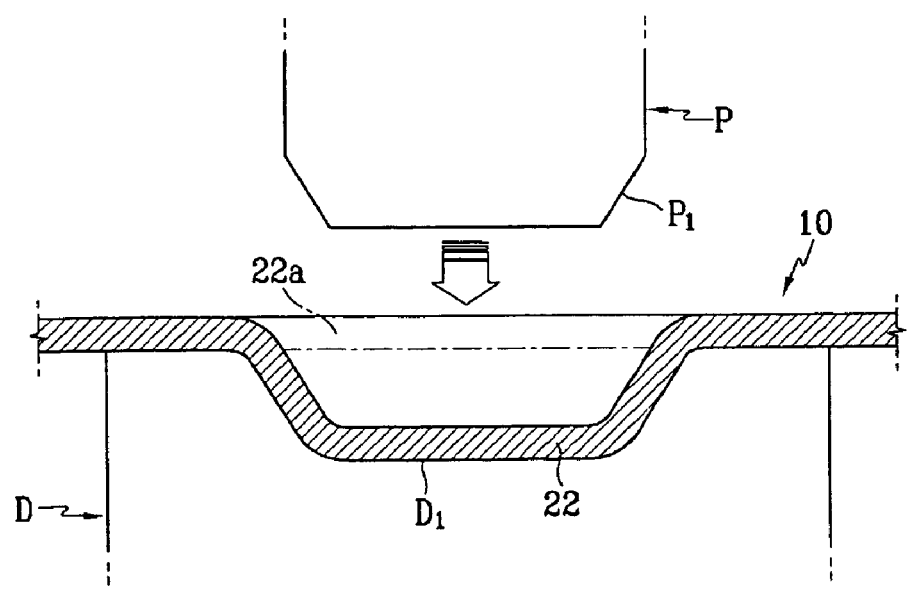

Subsequently, referring to FIGS. 5B through 5D, the chassis base 10 is set on a die D to accurately arrange each gripper body 22a in each pattern, for example, a first pattern $D_1$. In this case, each pattern $D_1$ has a concave groove used to bend the gripper body 22a toward external direction of the plane surface of the chassis base 10. Also, the first pattern $D_1$ has a shoulder C used to press the arc portions 25a.

Under the condition that the chassis base 10 is appropriately set on the die D, a punch P is pressed into a patterning portion $D_1$. In this case, the punch P is combined with the patterning portion $D_1$ in the manner of male/female combination, so that the gripper body 22a of the chassis base is bent in a predetermined shape. Further, the punch P has a punching portion $P_1$ which is projected from the bottom surface of the press P to bend the arc portions 25a. As a result, when the punching portion $P_1$ of the punch P is pressed into the patterning portion $D_1$ of the die D, the gripper body 22a of the chassis base 10 is pressed by the punching portion $P_1$. As a result, the gripper body 22a is formed in the shape of the concave groove of the patterning portion $D_1$. Simultaneously, the arc portion 25a of the gripper body 22a is biased and bent by the shoulder C of the punching portion $P_1$, so that the arc portion 25 shown in FIG. 2 is provided in both edges of the grip body 22.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A plasma display apparatus comprising:
    a plasma display panel;
    a chassis base including a first surface to which said plasma display panel is attached and a second surface on which a driving circuit module is installed; and
    at least one gripper provided on said second surface of said chassis base, said gripper being integrally formed from said second surface of said chassis base, said gripper being spaced-apart from a periphery of said second surface of said chassis base and protruding from said second surface of said chassis base.

2. The plasma display apparatus of claim 1, wherein at least a pair of grippers are provided in an upper end portion of said second surface and a lower end portion of said second surface, respectively.

3. The plasma display apparatus of claim 2, wherein the chassis base is formed by a press working process to comprise a rectangular shape including a pair of long sides and a pair of short sides, and said grippers are located in symmetrical positions with respect to a center axis of the long side of said chassis base.

4. The plasma display apparatus of claim 1, wherein said gripper has a grip body partitioned by a pair of parallel incision lines, and
    wherein said grip body is protruded toward an exterior of said second surface of said chassis base, and both ends of said grip body are integrally connected with said second surface of said chassis base.

5. The plasma display apparatus of claim 4, wherein the incision lines are formed in the direction of the long side of said chassis base.

6. The plasma display apparatus of claim 4, wherein the incision lines are formed in the direction of the short side of said chassis base.

7. The plasma display apparatus of claim 4, wherein the incision lines are formed by a slitting process or a notching process.

8. The plasma display apparatus of claim 4, wherein said gripper includes an arc portion formed by bending an edge of said grip body to make a thickness.

9. A method of manufacturing a chassis base for a plasma display apparatus, comprising:
    applying a press working process to a chassis base body to provide a chassis base;
    forming a pair of parallel incision lines on said chassis base; and
    pressing a portion partitioned by the incision lines toward a thickness direction of said chassis base to form a grip body.

10. The method of claim 9, wherein said pair of incision lines are formed by a slitting process.

11. The method of claim 9, wherein said pair of incision lines are formed by a notching process.

12. The method of claim 9, wherein said pair of incision lines are formed in each corner of said chassis base.

13. The method of claim 9, further comprising of bending an edge of said grip body to form an arc portion.

14. A plasma display apparatus, comprising:
    a plasma display panel;
    a chassis base including a first surface directly attached to said plasma display panel and a second surface installed directly with a driving circuit module; and
    a plurality of grippers provided on said second surface of said chassis base, said grippers being integrally formed from an interior region of said second surface of said chassis base, each one of said grippers projecting a grip body partitioned by at least a pair incision lines from said second surface of said chassis base.

15. The plasma display apparatus of claim 14, with said plurality of grippers being disposed on each corner of said second surface of said chassis base and said plurality of grippers being formed integrally in a single body with said chassis base.

16. The plasma display apparatus of claim 14, with said plurality of grippers comprising a pair of grippers disposed on upper left and right corners of said second surface or disposed on lower left and right corners of said second surface.

17. The plasma display apparatus of claim 14, with said plurality of grippers comprising a pair of grippers disposed in symmetric positions with respect to the center axis of the long side of said chassis base.

18. The plasma display apparatus of claim 14, with said plurality of grippers being disposed in center positions between each corner, symmetrically with respect to the center axis of the long side of said chassis base.

19. The plasma display apparatus of claim 14, with each one of said plurality of grippers including said grip body protruded from said second surface towards a direction away from said second surface accommodating a manual grasp of a user, the incision lines being elongated in a direction of either the long or short side of said chassis base, and a spacing hole being provided along a location of the incision lines and at least two ends of said grip body.

20. The plasma display apparatus of claim 14, with outer edge portions of said grip body being bent toward either said first or second surface to form an arc portion on at least two sides of said grip body parallel with an elongated side of the gripper and incision lines.

* * * * *